United States Patent
Joshi

(10) Patent No.: US 8,559,177 B2
(45) Date of Patent: Oct. 15, 2013

(54) FAN FOR COMPUTER ELEMENT IN THE SERVICE POSITION

(75) Inventor: Shailesh N. Joshi, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 198 days.

(21) Appl. No.: 12/937,333

(22) PCT Filed: Apr. 14, 2008

(86) PCT No.: PCT/US2008/060168
§ 371 (c)(1),
(2), (4) Date: Oct. 11, 2010

(87) PCT Pub. No.: WO2009/128814
PCT Pub. Date: Oct. 22, 2009

(65) Prior Publication Data
US 2011/0026221 A1    Feb. 3, 2011

(51) Int. Cl.
*H05K 7/20* (2006.01)
*H05K 5/00* (2006.01)

(52) U.S. Cl.
USPC ....... 361/695; 361/727; 361/679.48; 454/184

(58) Field of Classification Search
USPC .................... 361/694, 695, 724–727, 679.48; 454/184
See application file for complete search history.

(56) References Cited

U.S. PATENT DOCUMENTS

| | | | |
|---|---|---|---|
| 5,751,549 A | 5/1998 | Eberhardt et al. | |
| 6,213,819 B1 | 4/2001 | Fan | |
| 6,473,297 B1 | 10/2002 | Behl et al. | |
| 6,714,411 B2 | 3/2004 | Thompson et al. | |
| 6,826,456 B1 | 11/2004 | Irving et al. | |
| 6,867,967 B2 * | 3/2005 | Mok | 361/679.49 |
| 6,878,874 B2 | 4/2005 | Osborn et al. | |
| 7,319,299 B2 | 1/2008 | Freeman et al. | |
| 2003/0117782 A1 | 6/2003 | Wrycraft et al. | |
| 2004/0001311 A1 | 1/2004 | Doblar et al. | |
| 2004/0032722 A1 | 2/2004 | Wrycraft et al. | |
| 2004/0100770 A1 * | 5/2004 | Chu et al. | 361/698 |
| 2005/0024825 A1 | 2/2005 | Smith et al. | |
| 2005/0024826 A1 * | 2/2005 | Bash et al. | 361/695 |
| 2005/0099771 A1 | 5/2005 | Wei | |
| 2006/0278215 A1 * | 12/2006 | Gagas et al. | 126/299 D |
| 2007/0019382 A1 | 1/2007 | Gundlach | |
| 2007/0053154 A1 * | 3/2007 | Fukuda et al. | 361/687 |
| 2007/0274039 A1 | 11/2007 | Hamlin | |

FOREIGN PATENT DOCUMENTS

| | | |
|---|---|---|
| JP | 2000-200987 | 7/2000 |
| JP | 2002-319784 | 10/2002 |

OTHER PUBLICATIONS

International Search Report and Written Opinion, dated Jan. 16, 2009, 12 pages.

* cited by examiner

*Primary Examiner* — Zachary M Pape

(57) ABSTRACT

A system comprises a computer element (101) that moves into and out of a service position. The system further comprises a fan (106), separate from the computer element (101), that moves with the computer element (101) into and out of the service position. The fan (106) cools the computer element (101) while the computer element (101) is in the service position.

8 Claims, 6 Drawing Sheets

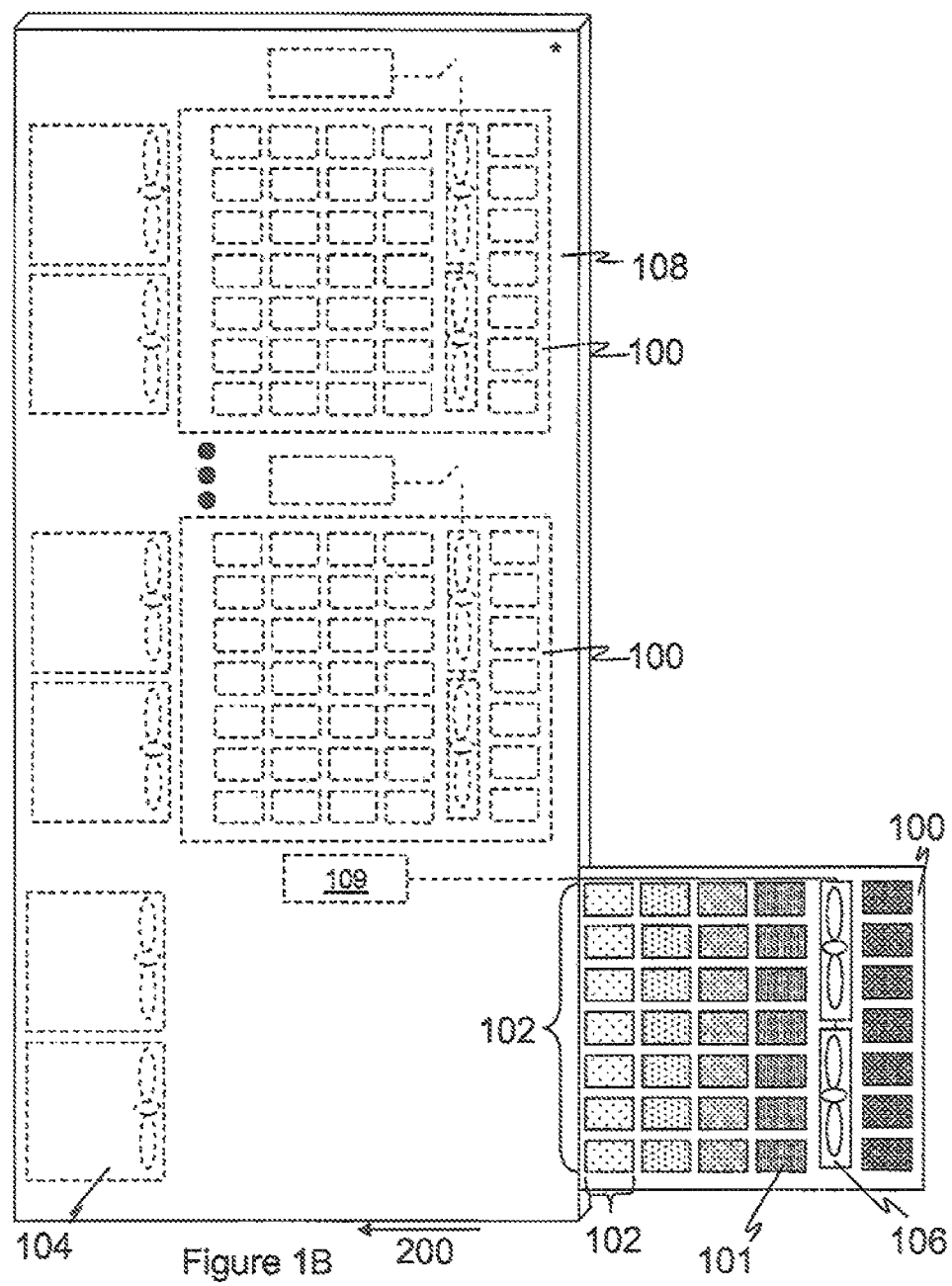

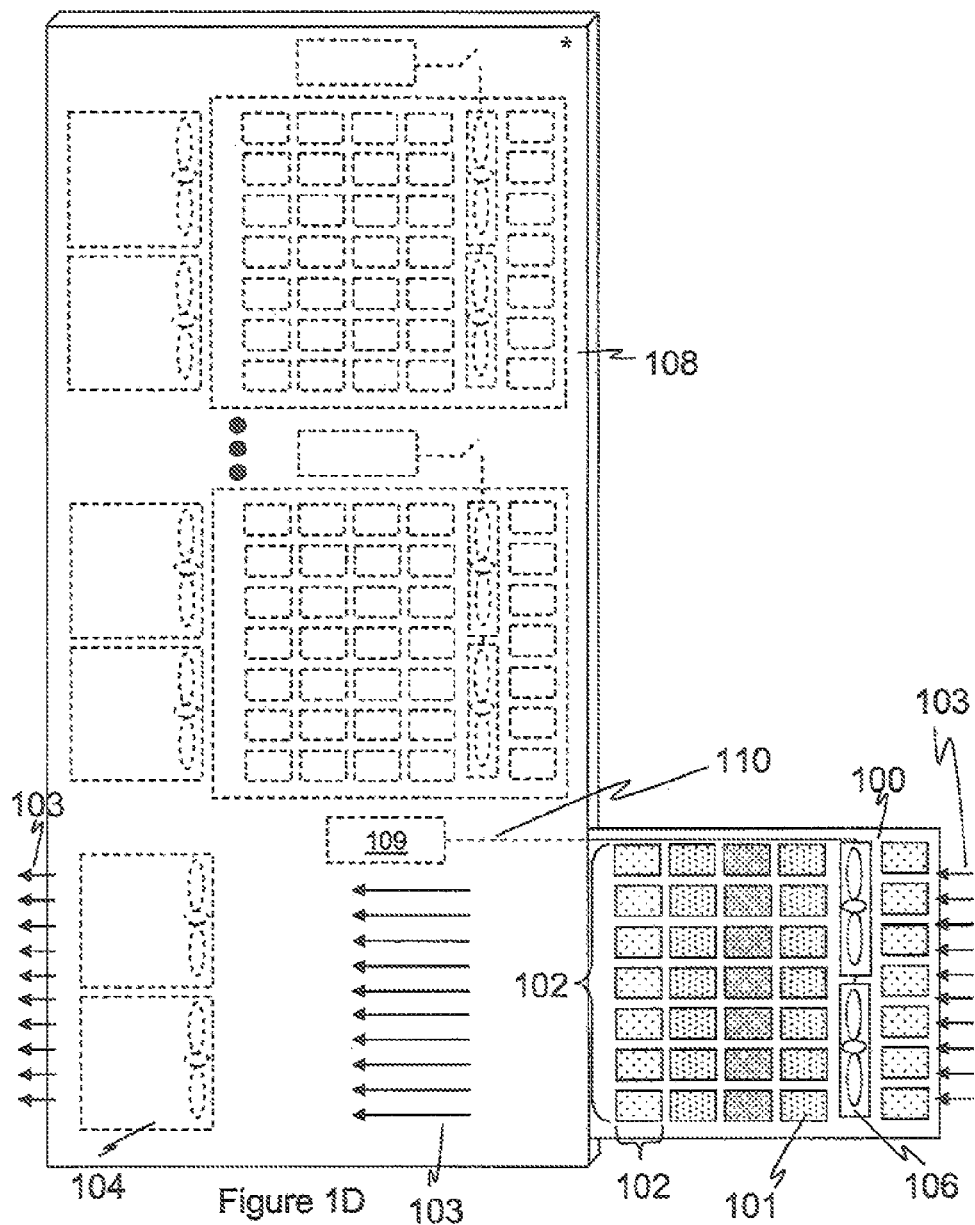

FAN FOR COMPUTER ELEMENT IN THE SERVICE POSITION

BACKGROUND

Computer elements such as computers (e.g., servers), data storage devices, data processing devices, etc., may be rack-mounted and may require service from time to time. Such service entails moving the computer element from its normal operating position into a service position for easier access to the computer element. Such a move sometimes entails moving neighboring computer elements concurrently even though the neighboring computer elements do not require service.

As computers are increasingly being required to perform vital tasks, powering off the computer element requiring service, or the neighboring computer elements, is undesirable. As such, the computer element and neighboring computer elements are increasingly operating under conditions for which they were not designed to operate, i.e., in the service position. Often the computer elements continue to operate when moved into the service position, which is not optimal in regards to cooling the computer elements. Additionally, servicing computer elements while they are out of the service position is also undesirable.

BRIEF DESCRIPTION OF THE DRAWINGS

For a more complete understanding of the present disclosure, reference is now made to the accompanying drawings and detailed description, wherein like reference numerals represent like parts:

FIG. 1B illustrates an enlarged side view of the housing comprising the drawer with the computer elements in the service position in accordance with at least some illustrative embodiments;

FIG. 1D illustrates an enlarged side view of the housing comprising the drawer with the computer elements in the service position in accordance with at least some illustrative embodiments;

NOTATION AND NOMENCLATURE

Certain terms are used throughout the following claims and description to refer to particular components. As one skilled in the art will appreciate, different entities may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Additionally, the term "system" refers to a collection of two or more hardware components.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

Figure 1A:
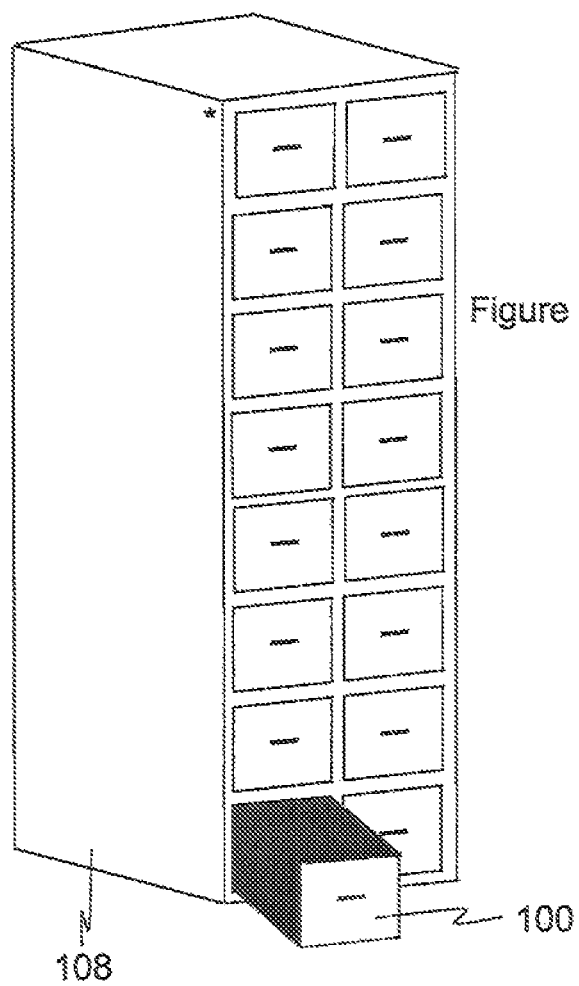
FIG. 1A illustrates a perspective view of a housing comprising drawers, at least one drawer comprising a fan cooling computer elements in the service position in accordance with at least some illustrative embodiments.

To overcome the obstacles outlined above, an apparatus and systems are disclosed. Preferably, the system comprises a housing. For example, FIG. 1A illustrates a computer rack 108 as the housing. However, any enclosure that houses computer elements is within the scope of this disclosure. FIG. 1A illustrates a perspective view of the computer rack 108. Preferably the computer rack is nineteen inches wide, although any size computer rack is within the scope of this disclosure. Computer elements designed to be placed in a computer rack 108 are described as rack-mounted, rack-mountable, a sub-rack, or having a rack-mounted chassis. A rack unit is a unit of measure used to describe the height of computer element mounted in a computer rack. One rack unit is defined by the industry as 1.75 inches high. The size of a piece of rack-mounted equipment is usually described as a number in "U." For example, two rack units, each 1 U high, would be 2 U all together. One rack unit is also referred to as "1 RU." Some computer elements are greater than 1 U high, and most computer racks are 42 U high. Computer elements placed in the computer rack 108 can be computers (e.g., servers), data storage devices (e.g., hard drives), data processing devices (e.g., processors), etc., but any computer element is within the scope of this disclosure.

In order to efficiently use space in a computer rack 108, the computer rack 108 is divided into sections by drawers 100. The drawers 100 support the weight of the computer elements housed in the computer rack 108. A computer rack can comprise any number of drawers 100 of any size in any position, and all such configurations are within the scope of this disclosure. In the preferred embodiment, the computer rack 108 comprises sixteen drawers 100 in two columns of eight drawers each. In at least one embodiment, the computer rack 108 comprises at least one backplane. A backplane is a circuit board with several connectors forming a computer bus. In an exemplary embodiment, the computer elements in the drawers 100 are hard drives, and the hard drives couple to the connectors to form a disk array, although any type of computer element is within the scope of this disclosure. The system preferably comprises at least one fan and at least one computer element, which are obscured in FIG. 1A.

Figure 1C:
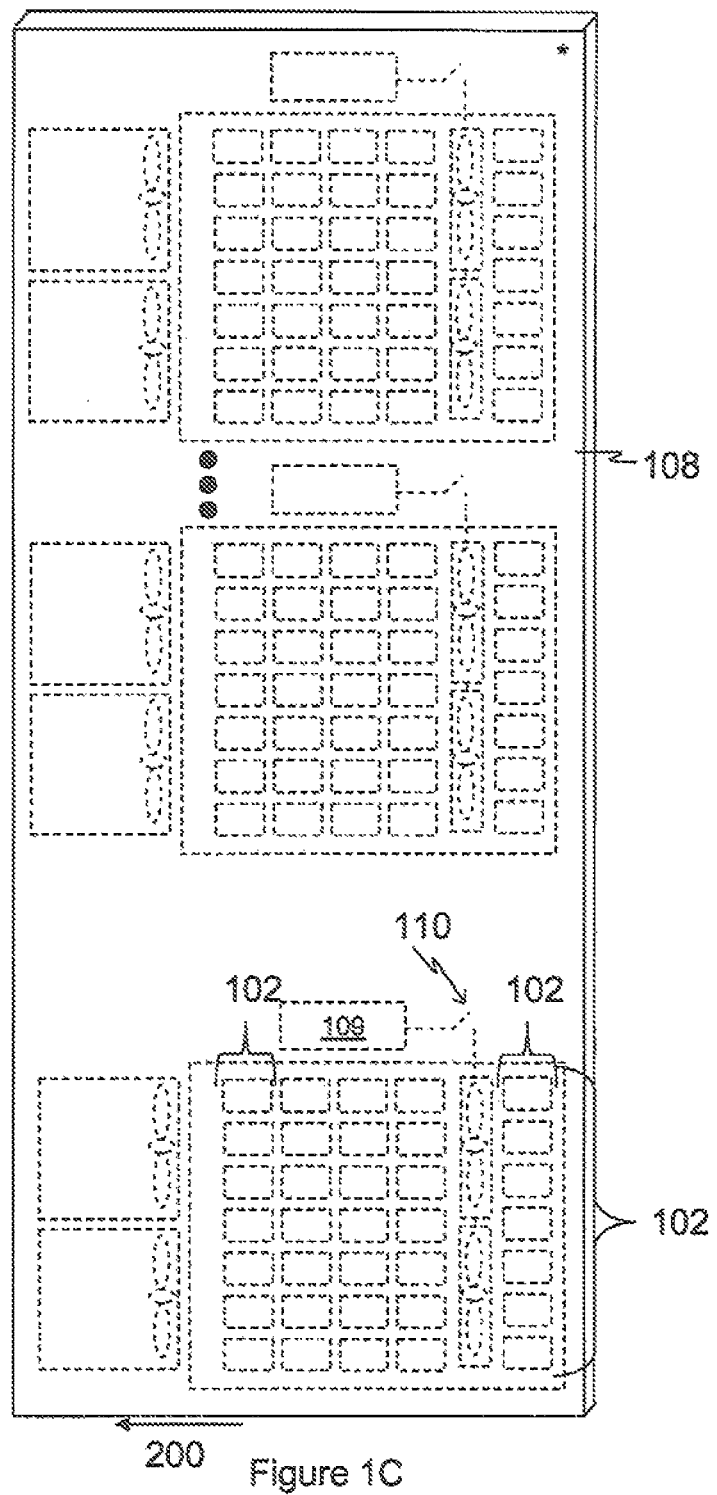
FIG. 1C illustrates an enlarged side view of the housing comprising the drawer with the computer elements out of the service position in accordance with at least some illustrative embodiments.
Figure 1E:
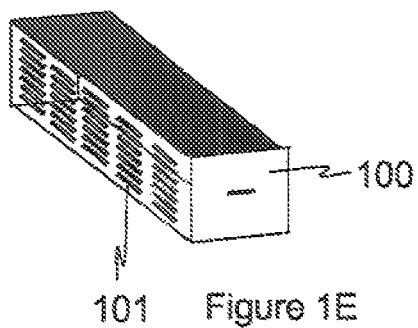
FIG. 1E illustrates a perspective view of the drawer with the computer elements shown without depicting the housing in accordance with at least some illustrative embodiments.

FIG. 1E illustrates a perspective view of the drawer 100 with the computer elements 101 shown. Note that for purposes of clarity only the computer elements are shown in FIGS. 1E-H. In the preferred embodiment, the drawer 100 supports 35 computer elements 101 in five columns, each column 102 comprising seven computer elements 101 in a stacked arrangement. However, any configuration is within the scope of this document.

Figure 1F:
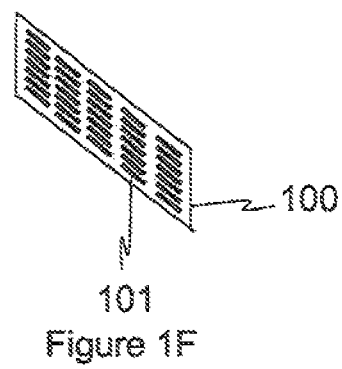
FIG. 1F illustrates a perspective view of the computer elements within the drawer without depicting the housing in accordance with at least some illustrative embodiments.

FIG. 1F illustrates a perspective view of the computer elements 101 within the drawer 100.

Figure 1G:
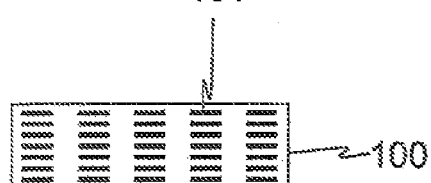
FIG. 1G illustrates a side view of the computer elements within the drawer without depicting the housing in accordance with at least some illustrative embodiments.

FIG. 1G illustrates a side view of the computer elements 101 within the drawer 100.

Figure 1H:
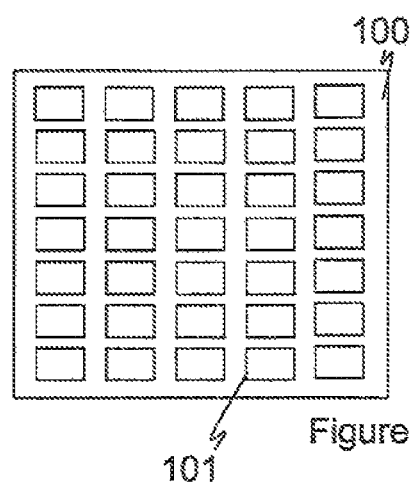
FIG. 1H illustrates an enlarged side view of the computer elements within the drawer without depicting the housing in accordance with at least some illustrative embodiments.

FIG. 1H illustrates an enlarged side view of the computer elements 101 within the drawer 100.

FIG. 1B illustrates a side view of the system such that the contents of the drawers can be seen. Note the asterisk used to denote the same housing wall across the figures, especially between FIG. 1A and FIG. 1B. For illustration purposes, only a few drawers 100 are shown. Other drawers behave the same as the illustrated drawers 100. The dashed lines represent structures not visible through the side wall of the computer rack 108. In at least one embodiment, the drawer 100 supports 35 computer elements 101 in five columns 102, each column 102 comprising seven computer elements 101 in a stacked arrangement. However, any configuration is within the scope of this document.

When a computer element 101 requires service, the drawer 100 containing the computer elements 101 is fully extended from the computer rack 108, allowing unhindered access to the computer elements 101. This position is called the service position. The computer elements 101 may require service for a variety of reasons. For example, one or more of the computer elements may need repairing, replacing, upgrading, etc. All of these tasks can be accomplished with greater ease if the computer elements 101 are in the service position and the computer administrator performing such service is not hindered by the rack 108 when accessing the computer elements 101. When service is completed on the computer element(s) 101, the drawer 100 is moved into the computer rack 108 in the direction indicated by arrow 200, resulting in the configuration shown in FIG. 1C.

FIG. 1C illustrates the computer elements 101 out of the service position. As illustrated, the computer elements 101 are out of the service position because the drawer 100 is not extended from the computer rack 108. Instead, the drawer 100 supports the computer elements 101 in their normal operating position within the rack 108.

While the computer elements 101 are out of the service position (in the normal operating position), at least one system fan 104 adequately cools the computer elements 101. A system fan 104 is more clearly seen in perspective in FIG. 2. A system fan 104, in some embodiments, is a fan coupled to the computer rack 108 that does not follow the computer elements 101 into or out of the service position. In the preferred embodiment illustrated in FIG. 1B, there are 6 such system fans 104, 2 for each drawer 100. The fans 104 are fixed to the computer rack 108, but not the drawer 100. As such, the fans 104 do not move with the computer elements 101 into and out of the service position, but remain in place while the computer elements 101 are moved into and out of the service position. Preferably, the system fans 104 allow air to flow in the direction indicated by arrow 200, drawing air over the computer elements 101 and blowing air out of the rack 108 while the computer elements 101 are out of the service position. A system fan 104 can also be a fan integrated into a computer element 101, e.g., a server fan integrated into a server. There are no such system fans shown.

Returning to FIG. 1B, while in the service position, the computer elements 101 are operational, save perhaps the particular computer element(s) 101 requiring service, and generating heat that must be dissipated. Furthermore, the computer elements 101 are not adequately cooled by the system fans 104 because the computer elements 101 are not sufficiently close to the system fans 104, or there is not a sufficiently directed airflow to achieve proper cooling. If the time necessary for service is too great, or if the computer elements 101 are left unchecked in the service position, the computer elements 101 will exceed operational temperatures and fail. The computer elements closest to the system fans 104 will increase in temperature slower than the computer elements further away. Such variability is represented by the patterned shading in the computer elements 101. The shading grows more dense for computer elements 101 that will increase in temperature faster. The computer elements 101 furthest from the system fans 104 will fail first because their temperatures will rise fastest. These computer elements 101 are illustrated with the densest shading pattern.

To help adequately cool computer elements 101 that are extended into the service position, various embodiments provide at least one booster fan 106 that moves with the computer elements 101 into and out of the service position. FIG. 1B illustrates only a side view of the booster fans 106; a booster fan 106 is more clearly seen in perspective in FIG. 3. A booster fan 106 is a fan that follows the computer elements 101 into and out of the service position, but is separate from the computer elements 101. For example, a booster fan 106 is not integrated into a server housed in the computer rack 108. The booster fans 106 can also be called non-system fans or service fans. As illustrated in FIG. 1B, there are 6 such booster fans 106, two for each drawer 100. However, any number and locations of booster fans 106 are within the scope of this disclosure. Preferably, the booster fans 106 are coupled to the drawer 100. In at least one embodiment, the drawer 100 comprises a supporting member (not pictured) to which the booster fans 106 are mounted with screws. In another embodiment, the booster fans 106 are glued inside the drawer 100. However, any method of mounting is within the scope of this disclosure. In any case, the booster fans 106 cool the computer elements 101 while the computer elements 101 are in the service position.

FIG. 1D illustrates the effect of such cooling. Specifically, the computer elements 101 furthest from the system fans 104 are no longer in danger of failing, as illustrated by the patterned shading. Preferably, the booster fans 106 allow air to flow as represented by arrows 103. Specifically, the booster fans 106 draw air over the column 102 of computer elements depicted furthest on the right in the illustration, and blow air over the remaining columns 102 of computer elements. Also, in at least one embodiment, the system fans 104 blow this air out of the computer rack 108. However, multiple configurations of air flow exists, and each configuration is within the scope of this disclosure.

Preferably, the booster fans 106 behave identically to each other, the only difference being their location. Preferably, the system fans 104 also behave identically to each other, the only difference being their location. In at least one embodiment, the booster fans 106 are powered only while the computer elements 101 are in the service position. For example, a driver circuit 109 powering the booster fans 106 is completed only when the computer elements 101 are in the service position. Preferably, the power circuit comprises circuit and logic elements such as voltage sources, resistors, and capacitors. As illustrated, a switch 110 connecting the driver circuit 109 to the coupled booster fans 106 is open while the computer elements 101 are out of the service position (FIG. 1C), and the switch 110 is closed while the computer elements 101 are in the service position (FIG. 1D). As such, the booster fans 106 will save power and wear, compared to booster fans 104 that are constantly powered, thus needing infrequent replacement.

As mentioned, the computer elements 101 are in normal operating position when fully enclosed by the rack 108. However, merely placing the computer elements 101 into the service position does not mean the computer elements 101 cannot operate; rather, the computer elements 101 are easier to access in the service position. Additionally, there are numerous positions between normal operating position and the service position. For example, one of the "in-between" positions is when the drawer 100 is halfway extended from the rack 108 and some computer elements 101 are enclosed by the rack 108 while other computer elements 101 are not enclosed by the rack 108. For these in-between positions, a computer administrator can decide the behavior of the booster fans 106. For example, the booster fans 106 may be powered throughout the in-between positions by configuring the switch 110 to close as soon as the computer elements 101 move from normal operating position. Considering another example, the booster fans 106 may be powered only when every computer element 101 is in the service position, effectively ignoring the in-between positions, by configuring the switch 110 to close when the drawer 100 is fully extended from the rack 108. As such, the switch can be implemented in a number of ways, and each way is within the scope of this disclosure. For example, in at least one embodiment, when the drawer 100 is fully extended, the drawer 100 depresses a contact that completes the driver circuit 109, powering the booster fans 106. When the drawer 100 is not fully extended, the contact is not depressed, and the driver circuit is not complete, causing the booster fans 106 to be powered off.

In at least one embodiment, the booster fans 106 and system fans 104 are on opposite sides of the computer elements being cooled 101. As illustrated in FIG. 1B, the multiple columns 102 of computer elements 101 comprise five columns of computer elements 101, and the booster fans 106 are located between a first column of computer elements and a second column of computer elements, from right to left in the illustration. Additionally, the system fans 104 are located outside of a fifth column of computer elements.

Figures 2, 3:
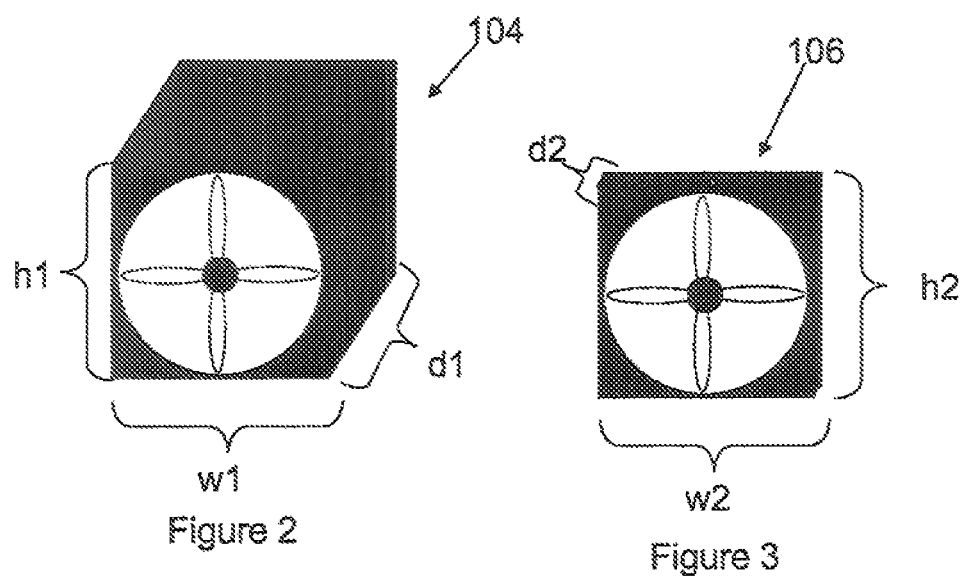
FIG. 2 illustrates a system fan in accordance with at least some illustrative embodiments.
FIG. 3 illustrates a booster fan in accordance with at least some illustrative embodiments.

FIG. 2 illustrates a system fan in perspective. In at least one embodiment, the system fan 104 is placed at the rear of the computer rack 108 to direct air towards the rear of the computer rack 108. Preferably, the system fan 104 has a height (h1) of 80 mm, a width (w1) of 80 mm, and a depth (d1) of 6 inches. However, a system fan 104 having any dimensions is within the scope of this disclosure. FIG. 3 illustrates a booster fan. In at least one embodiment, the booster fan 106 directs air towards the rear of the computer rack 108. Preferably, the booster fan 106 has a height (h2) of 92 mm, a width (w2) of 92 mm, and a depth (d2) of 25 mm. However, a booster fan 106 having any dimensions is within the scope of this disclosure. In at least one embodiment, the booster fan 106 has different dimensions than the system fan 104 due to space restrictions in the computer rack 108. For example, mounting a booster fan 106 between the columns 102 of computer elements 101 furthest away from a system fan 104 will limit the size of the booster fan 106, as will the decision to use more than one booster fan 106. However, any configuration of booster fans 106 and system fans 104 is within the scope of this disclosure.

The above disclosure is meant to be illustrative of the principles and various embodiment of the present invention. Numerous variations and modifications will become apparent to those skilled in the art once the above disclosure is fully appreciated. It is intended that the following claims be interpreted to embrace all variations and modifications.

What is claimed is:

1. A system, comprising:
    a computer element that moves into and out of a service position;
    a first fan, separate from the computer element that moves with the computer element into and out of the service position, the first fan cooling the computer element while the computer element is in the service position;
    a second fan that cools the computer element while the computer element is out of the service position; and
    a housing that encloses the computer element while the computer element is out of the service position, the second fan coupled to the housing, the housing comprises a computer rack wherein the computer element is in the service position when a drawer supporting the computer element is extended from the computer rack.

2. The system of claim 1, wherein the second fan does not move into or out of the service position with the computer element.

3. The system of claim 1, wherein the computer element is part of multiple columns of computer elements that move into and out of the service position together, the first fan cooling the multiple columns of computer elements while the multiple columns of computer elements are in the service position.

4. The system of claim 3, wherein the second fan cools the multiple columns of computer elements while the multiple columns of computer elements are out of the service position.

5. The system of claim 4, wherein the multiple columns of computer elements comprise five columns of computer elements, wherein the first fan is located between a first column of computer elements and a second column of computer elements, and wherein the second fan is located outside of a fifth column of computer elements.

6. The system of claim 1, further comprising a circuit that powers the first fan only when the computer element is in the service position.

7. The system of claim 6, wherein the circuit comprises a switch that electrically breaks the circuit when the computer element is out of the service position.

8. The system of claim 1, wherein the computer element is selected from the group consisting of a data storage device, a data processing device, and a server.

* * * * *